United States Patent [19]

Shanks

[11] 4,180,866
[45] Dec. 25, 1979

[54] SINGLE TRANSISTOR MEMORY CELL EMPLOYING AN AMORPHOUS SEMICONDUCTOR THRESHOLD DEVICE

[75] Inventor: Roy R. Shanks, San Diego, Calif.

[73] Assignee: Burroughs Corporation, Detroit, Mich.

[21] Appl. No.: 820,869

[22] Filed: Aug. 1, 1977

[51] Int. Cl.² .................... H01L 45/00; G11C 11/24
[52] U.S. Cl. ........................................ 365/186; 357/2; 357/14; 357/48; 365/150; 365/163
[58] Field of Search ............... 307/238, 324, 252 E; 357/2; 365/150, 163, 186

[56] References Cited

U.S. PATENT DOCUMENTS

| | | | |
|---|---|---|---|
| 3,699,543 | 10/1972 | Neale | 357/2 |
| 3,761,896 | 9/1973 | Davidson | 357/2 |
| 3,796,931 | 3/1974 | Maute | 357/2 |
| 3,886,577 | 5/1975 | Buckley | 357/2 |
| 3,898,483 | 8/1975 | Sander et al. | 307/238 |

OTHER PUBLICATIONS

C. H. Sie, "Memory Cell using Bistable Resistivity...", thesis, Iowa State University Engr'g R's'ch Inst., May 1969, pp. 28–32.

Primary Examiner—William D. Larkins
Attorney, Agent, or Firm—Mervyn L. Young; Kevin R. Peterson

[57] ABSTRACT

A single transistor memory cell wherein the memory cell is provided by the base collector capacitance of the transistor in the integrated circuit chip. Mounted on top the chip in electrical contact with the base of the transistor is an amorphous semiconductor threshold device employing a tellurium based chalcogenide such that when a charge is applied to the terminal of the device opposite the transistor base, the device will be switched to a high conducting state until such time as the base collector capacitance has been charged and then the threshold device will be switched to a low-conducting state. Specifically, the amorphous threshold device employs $Ge_{15}Te_{81}Sb_2S_2$.

7 Claims, 19 Drawing Figures

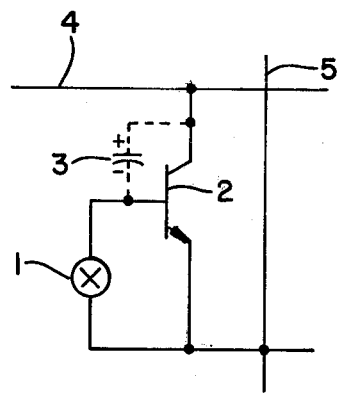
FIG. IA
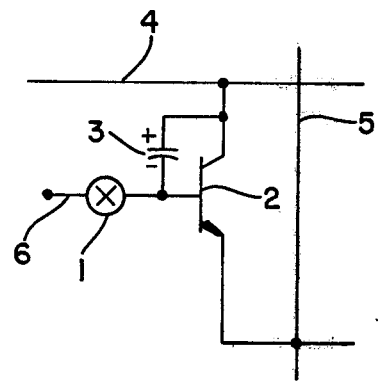
FIG. IB
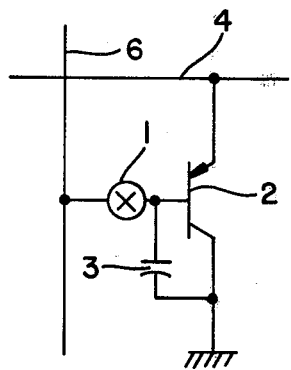
FIG. IC
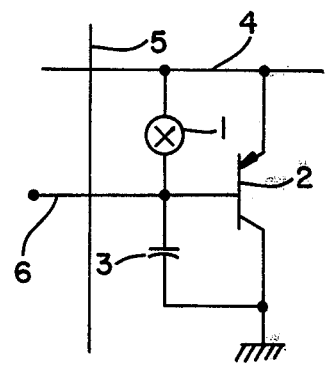
FIG. ID
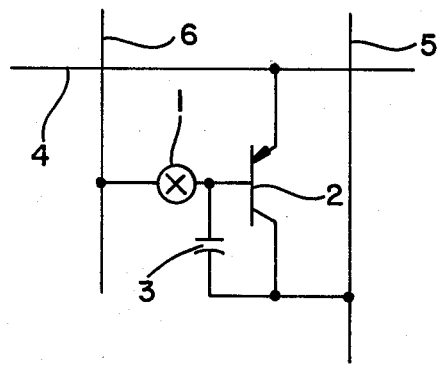
FIG. IE
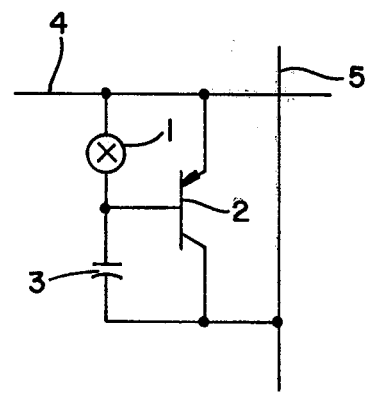
FIG. IF

SINGLE TRANSISTOR MEMORY CELL EMPLOYING AN AMORPHOUS SEMICONDUCTOR THRESHOLD DEVICE

BACKGROUND OF THE INVENTION

1. Field of Invention

This invention relates to a memory cell having a single transistor with a base-collector capacitance and more particularly to such a memory cell employing an amorphous semiconductor threshold device to charge the capacitance of the cell.

2. Description of the Prior Art

Single transistor memory cells are highly desirable because they allow greater packing density than can be achieved with semiconductor latches. The advantage of semiconductor latches is that they are relatively static while the single transistor cell must be periodically refreshed and restored. However, such semiconductor latches require at least two gates in the cell thereby increasing the area required for the cell and reducing its packing density.

A problem in the bipolar implementation of single transistor cells is that base-emitter breakdown is employed to charge the capacitance of the cell which causes the base to degrade and damages the transistor. To overcome this problem, a two transistor cell has been employed where one transistor is specifically employed to charge the capacitance of the cell. Such a bipolar memory circuit is disclosed in the Sander et al U.S. Pat. No. 3,898,243. However, because the cell now employs two gates, the area required to implement the cell is increased and the packing density is decreased. In place of the second switching transistor, a switching diode may be employed.

It has been discovered that certain amorphous semiconductor materials are capable of being employed as a threshold device and can be switched from a high resistance state to a low resistance state. Particular materials that may be employed are disclosed in the Ovshinsky U.S. Pat. No. 3,271,591, the Dewald et al U.S. Pat. No. 3,241,009, and the Neale U.S. Pat. No. 3,699,543 and the Buckley U.S. Pat. No. 3,886,577.

A particular type of amorphous semiconductor material is the tellurium based chalcogenide class of materials which have a general formula:

$$Ge_A Te_B X_C Y_D$$

The X constituent may be antimony, bismuth or arsenic, while the Y constituent may be sulfur or selenium.

Such amorphous high resistance semiconductor material can be placed between a pair of spaced apart electrodes such that the application to one of those electrodes of a voltage pulse, about a given threshold, switches the device to its low resistance state. Such materials can be employed to build a switching device structure on top of the silicon wafer in which the bipolar device structure is fabricated with its collector base capacitance. This should reduce the area required for memory cell and increase its packing density.

It is then an object of the present invention to provide an improved single transistor memory cell.

It is another object of the present invention to provide an improved single transistor memory cell having reduced area requirements and higher packing density.

It is still another object of the present invention to provide a single transistor memory cell employing an amorphous semiconductor threshold device for employment in charging the base-collector capacitance of the transistor, which combination may be fabricated in a layered structure so as to reduce the memory area requirements.

SUMMARY OF THE INVENTION

The present invention is directed toward a single transistor memory cell wherein the memory cell is provided by the base collector capacitance of the transistor in the integrated circuit chip. Mounted on top the chip in electrical contact with the base of the transistor is an amorphous semiconductor threshold device employing a tellurium based chalcogenide such that when a charge is applied to the terminal of the device opposite the transistor base, the device will be switched to a high conducting state until such time as the base collector capacitance has been charged and then the threshold device will be switched to a low-conducting state. Specifically, the amorphous threshold device employs $Ge_{15}Te_{81}Sb_2S_2$.

A feature, then, of the present invention resides in a memory cell having a single transistor and also amorphous semiconductor device with one terminal electrically connected to the base of the single transistor structure with the threshold device employing a layer of a tellurium based chalcogenide as the threshold switching structure such that when a charge is applied to the terminal of the device opposite the transistor base connection, the device will be switched to a high conducting state to charge the base-collector capacitance of the transistor and then will be switched to a low-conducting state.

DESCRIPTION OF THE DRAWINGS

The above and other objects, advantages and features of the present invention will become more readily apparent from a review of the following specification when taken in junction with the drawings wherein:

FIGS. 1A–F are schematic diagrams representing various embodiments of the present invention;

A GENERAL DESCRIPTION OF THE INVENTION

Before describing the amorphous semiconductor threshold switch of the present invention, a description will first be given of single transistor memory cells employing such amorphous semiconductor devices. Such cells are illustrated in FIGS. 1A–F. In each of these figures, the cell is formed of the amorphous semiconductor switch 1 and a transistor structure 2 which employs the inherent base-collector capacitance 3 of transistor 2. In FIGS. 1A, 1B and 1D–1F, the cell is driven by selective activation of the X read and write line 4 and Y read and write line 5. In FIGS. 1B and 1C, the cell is activated by a signal on a separate write line 6. The embodiment of FIG. 1C has single access selectivity only and therefore has no matrix capability.

Figure 2:
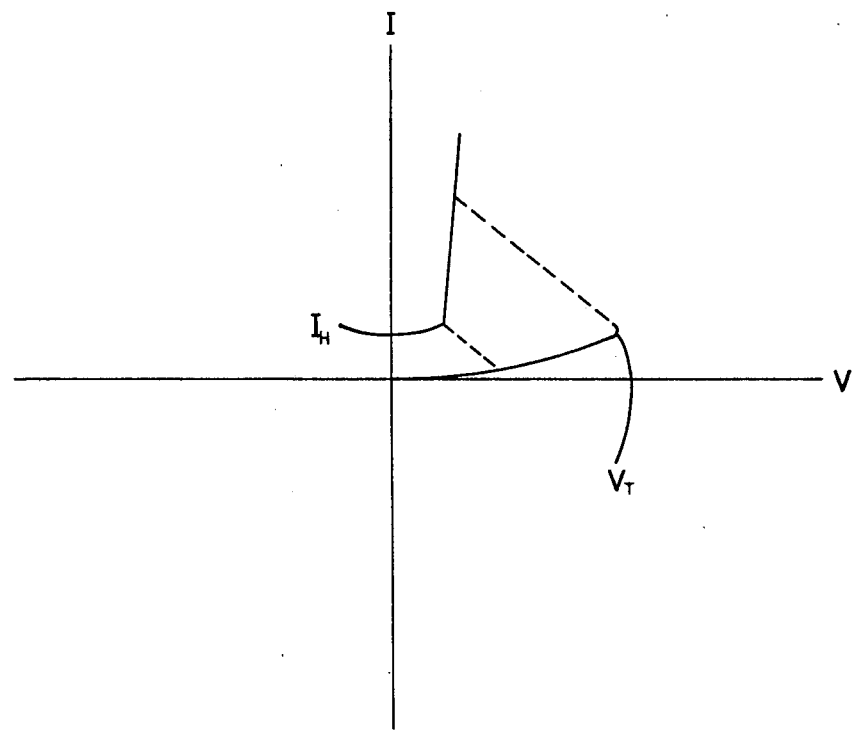
FIG. 2 is a diagram of the voltage current characteristic of the threshold device of the present invention.

The voltage-current characteristic of the amorphous semiconductor threshold device employed in the present invention is illustrated in FIG. 2. As shown therein, the device is characterized by a high resistance up to a given threshold voltage level whereupon the device then switches to a low resistance high conductivity device until the current decreases to a critical hold in value through the device in which case it will return to a high resistance state.

As was indicated above, the present invention employs an amorphous semiconductor material which is of the tellurium based chalcogenide class materials:

$$Ge_A Te_B X_C Y_D$$

A preferred embodiment of the present invention employs the material $Ge_{15}Te_{81}Sb_2S_2$.

The above referenced Dewald et al and Ovshinsky patents indicate that such chalcogenides can be employed in two different manners, namely as either a threshold device or a memory storage element. In the storage element mode the chalcogenide layer goes through a threshold as the voltage is increased and then switches to a low resistance high conductivity element. If the current is maintained therethrough for a few milliseconds, the amorphous semiconductor material then switches to at least a partial crystalline state after which the current may be removed and the layer becomes a semi-permanent memory element for a read only memory until such time as it is reset. In the threshold mode, the chalcogenide layer is then taken through its threshold value where it switches to a low resistance high conductivity element but then the current is removed and it will return to its high resistance, low conductivity state. In the threshold mode, the chalcogenide layer can be employed as a threshold switch and that is the manner in which it is employed in the present invention rather than as a memory element as disclosed in the above referenced Buckley patent.

DETAILED DESCRIPTION OF THE INVENTION

Figure 3A:
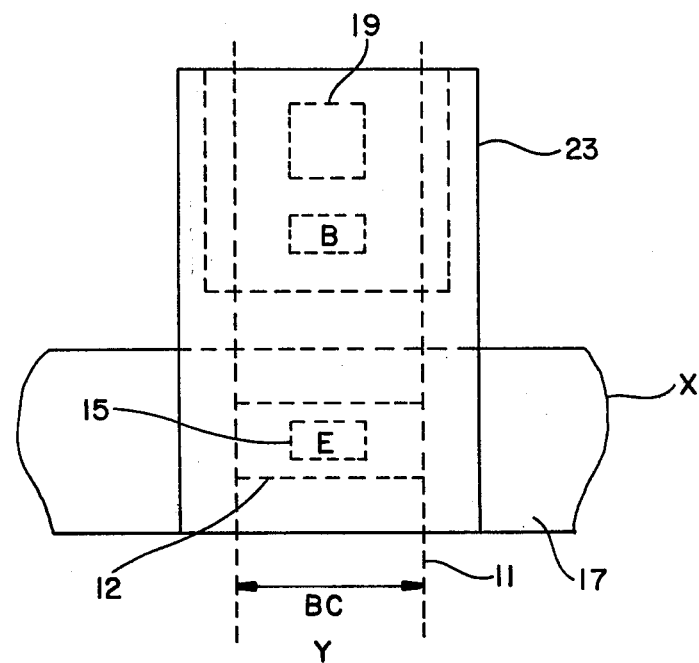
FIGS. 3A–6B are plan and cross-sectional views illustrating various embodiments of the present invention.
Figure 3B:
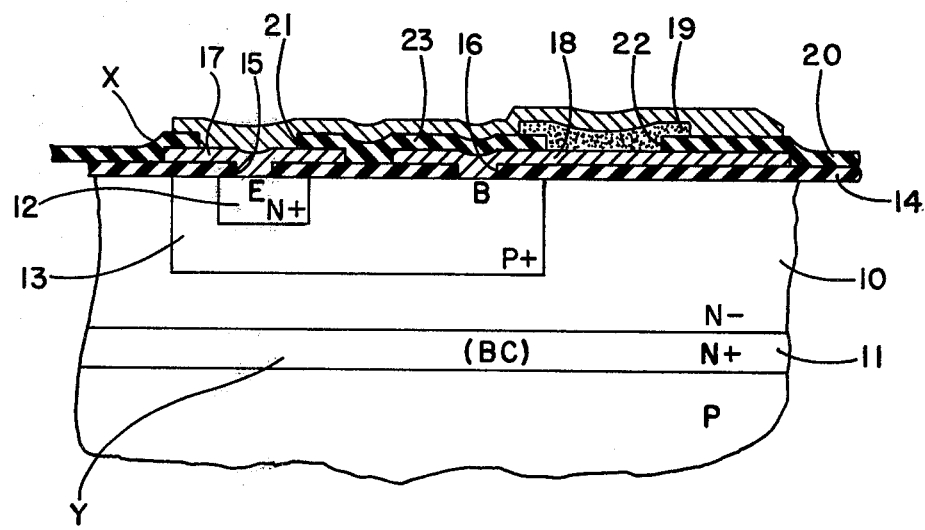

A particular embodiment of the present invention is illustrated in FIGS. 3A and 3B, where FIG. 3A is a plan view of this embodiment while FIG. 3B is a cross sectional view of the same embodiment. As indicated in FIG. 3B NPN transistor is formed in a silicon substrate in a conventional manner, with the collector region 10 being formed with an N−conductivity and is in electrical contact with buried connector 11 which is of N+ conductivity. The transistor thus formed is covered with passivation layer 14, except for contact holes 15 and 16 which are provided for electrical contact respectively with emitter 12 and base 13.

X conductor 17 is then applied to make contact with emitter 12 and base conductor 18 is supplied for subsequent contact with threshold switch 19 that will be more thoroughly described below. Second passivation layer 20 is then applied to cover the respective conductors 17 and 18 except for vias 21 and 22.

Figure 3C:
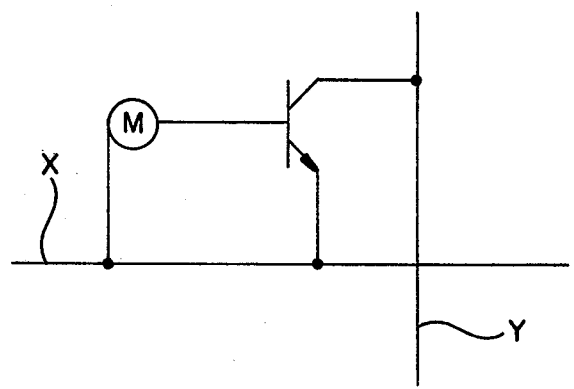

Threshold switch 19 is formed of a tellurium base chalcogenide which in the present invention is preferably $Ge_{15}Te_{81}Sb_2S_2$. Threshold device 19 is formed in via 22 in electrical contact with base conductor 18. Finally, conductor 23 is formed over passivation layer 20 to make electrical contact between threshold device 19 and X conductor 17. The electrical circuit thus formed is illustrated in FIG. 3C and is the same as the single transistor memory circuit illustrated in FIG. 1A.

Figure 4A:
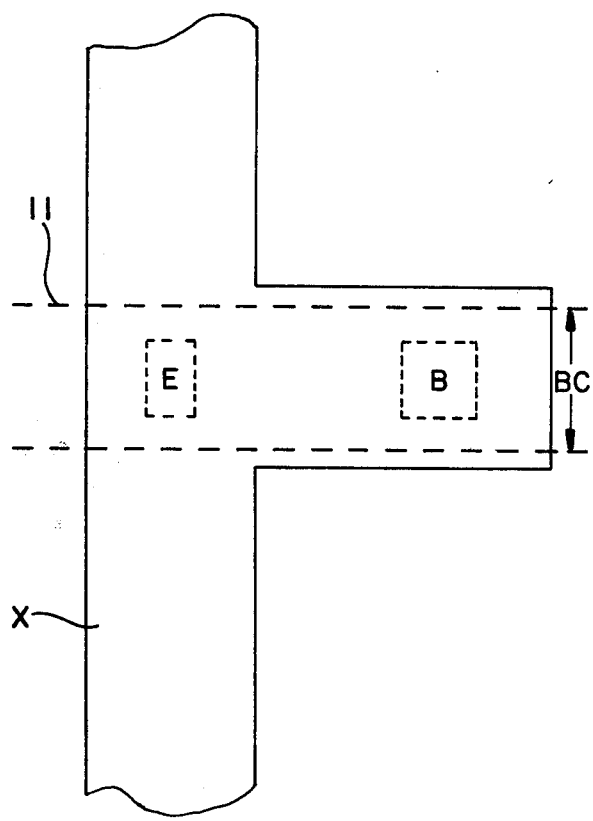
Figure 4B:
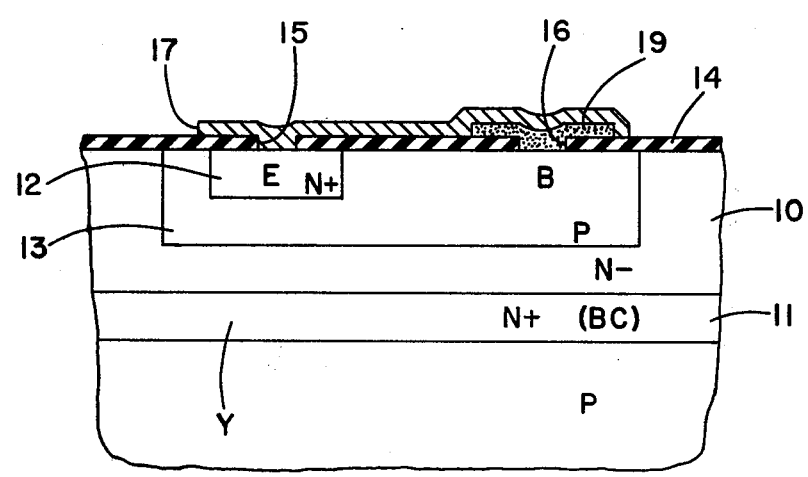

FIGS. 4A and 4B are a plan view and cross sectional view respectively of another embodiment of the present invention implementing the same memory cell of FIG. 1A except that this embodiment only employs one metalization step and one passivation step. The advantage of the embodiment of FIGS. 4A and 4B is simplified fabrication resulting from the elimination of two device levels.

Figure 5A:
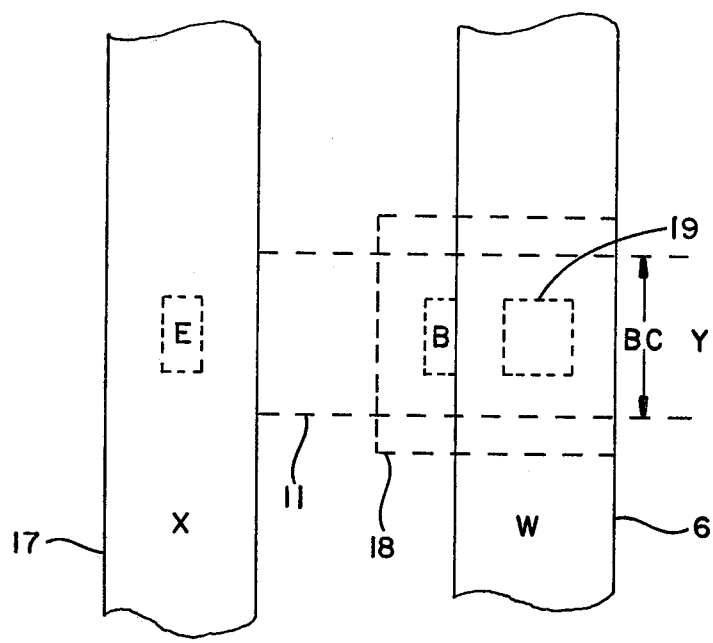
Figure 5B:
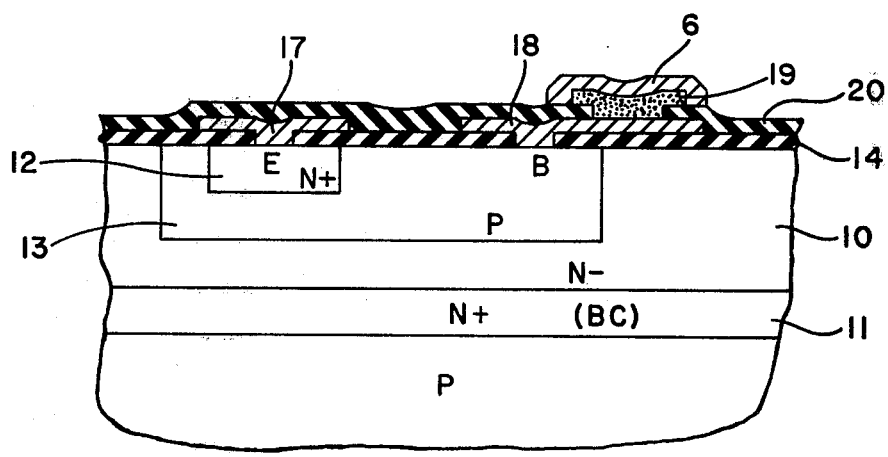
Figure 5C:
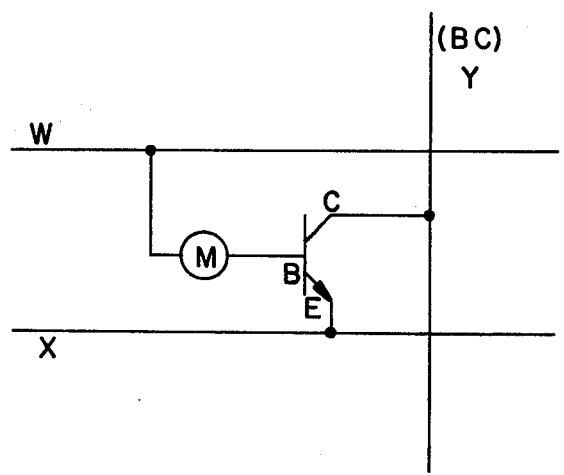

FIGS. 5A and 5B illustrate an embodiment of the invention utilizing the memory cell of FIG. 1B which cell may be written into upon activation of separate write line 6. The embodiment of FIGS. 5A and 5B again employ the double metalization process.

Figure 6A:
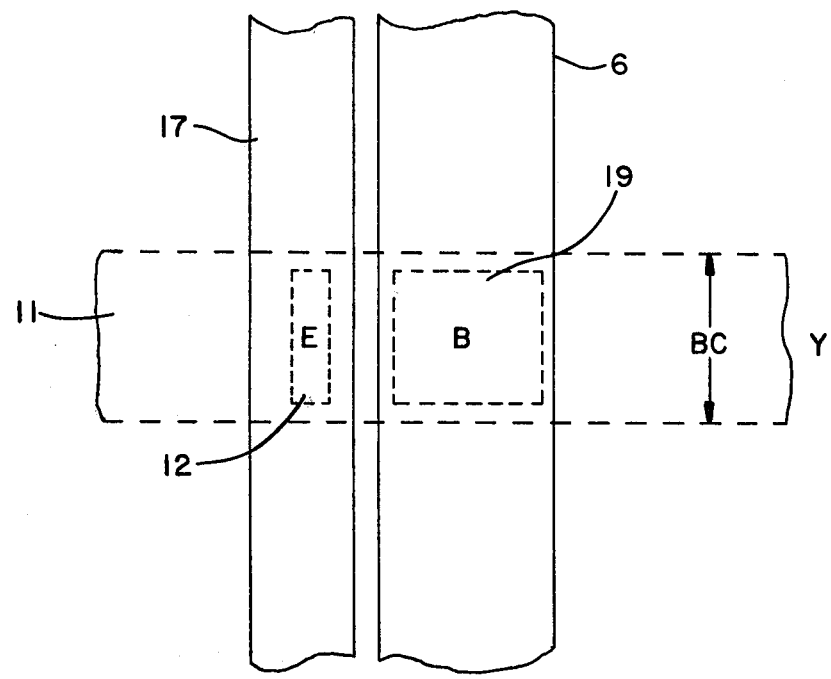
Figure 6B:
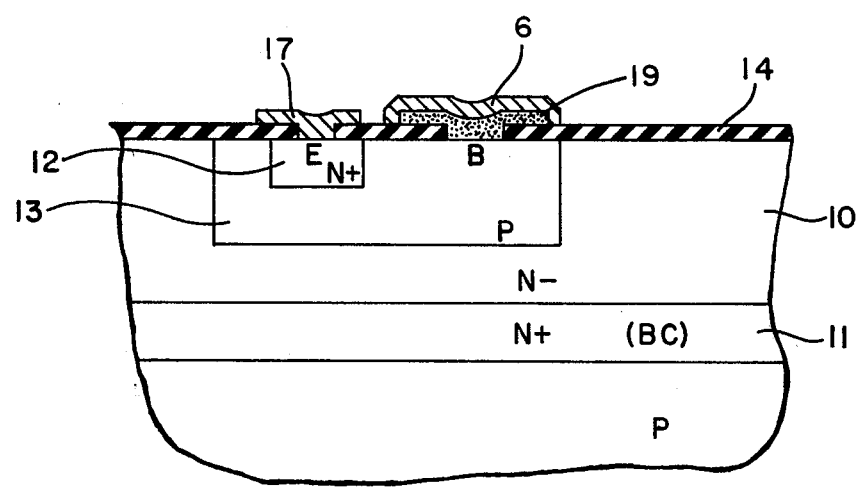

FIGS. 6A and 6B are an embodiment of the memory cell of FIG. 1B and differs from the embodiment of FIGS. 5A and 5B in that only one metalization step is required.

As was indicated above as in relation to FIG. 2, the present invention employs the tellurium based chalcogenides as a threshold device. When it is desired to charge the capacitance of the memory cell, a voltage is applied to the threshold device only long enough to charge up the capacitance. During this time, the threshold device switches from a high resistance low conductivity device to a low resistance high conductivity device while the capacitance is charging, after which the current drops below approximately 0.3–0.7 milliamps. As indicated in FIG. 2, this is a sufficient drop to turn off the threshold device and it returns to its zero state.

Figure 7:
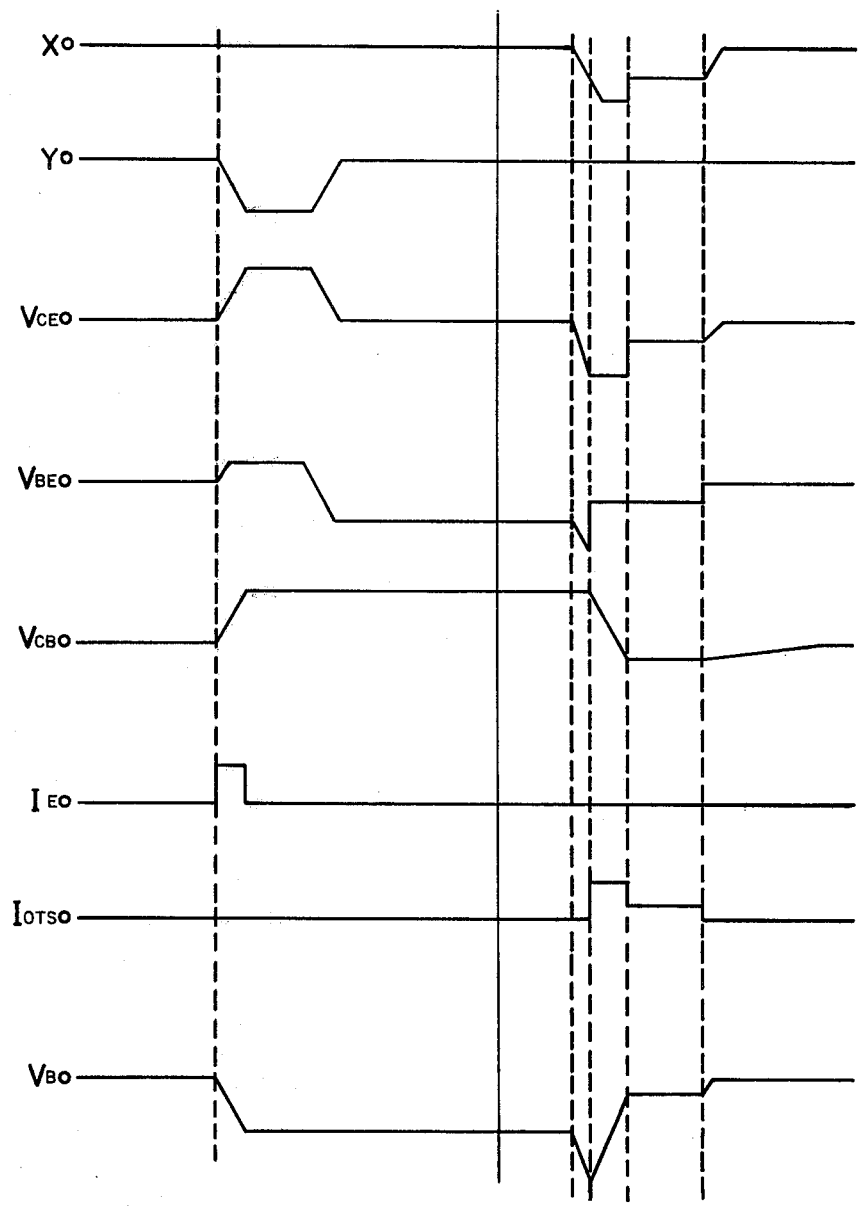
FIGS. 7 and 8 are timing wave forms illustrating the operation of the present invention.
Figure 8:
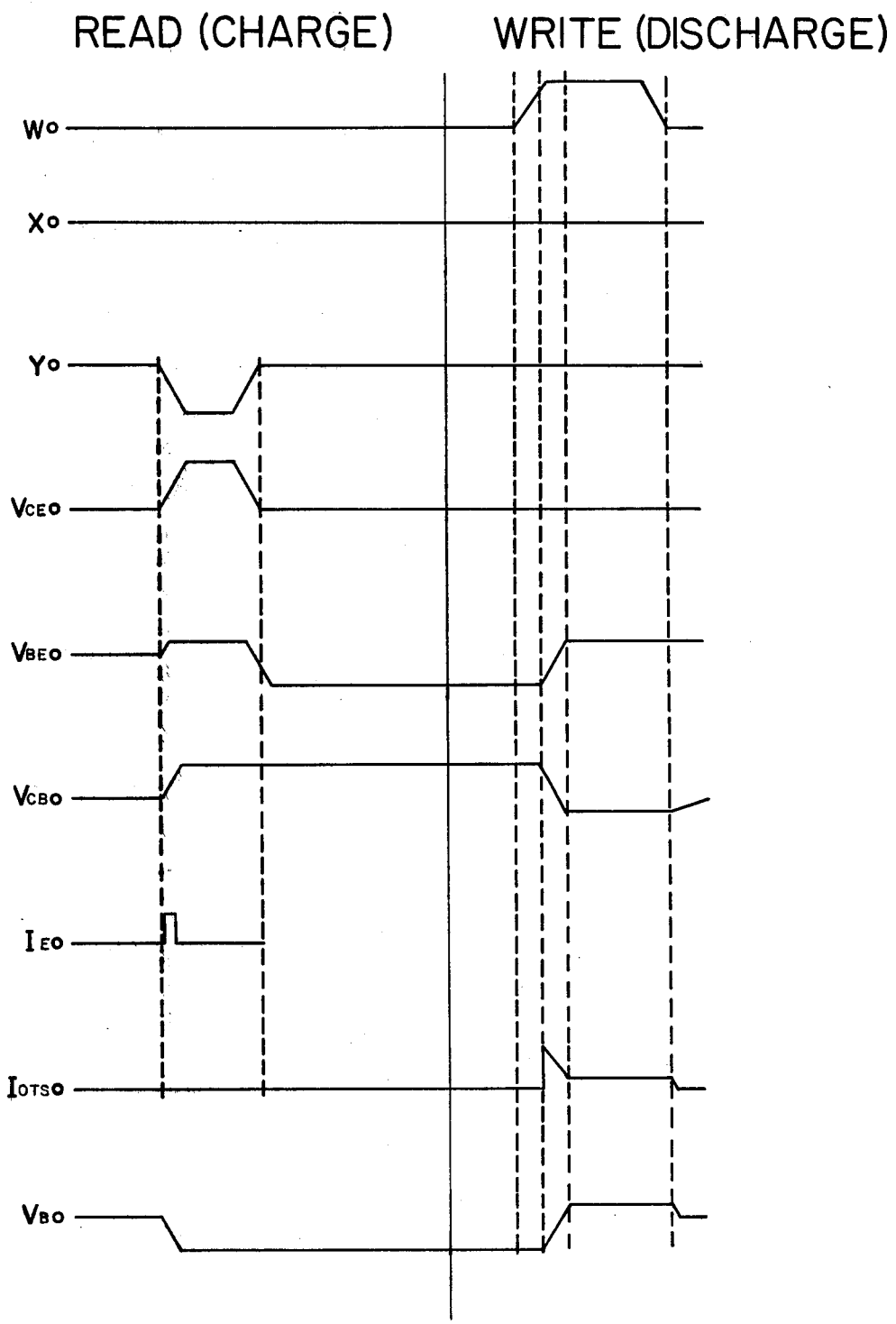

FIGS. 7 and 8 show the wave forms representing the operation of two embodiments of the present invention. FIG. 7 are the wave forms for the memory cell of FIG. 1A as embodied in the structure of FIGS. 3A and 3B. FIG. 8 represents the wave forms for the memory cell of FIG. 1B as embodied in the structure of FIGS. 5A and 5B. In FIG. 7, X and Y represent the application of the X and Y voltage pulses for each and write operations on the respective memory cell. $V_{CE}$ represents the voltage change across the collector and emitter of the single transistor cell. $V_{BE}$ represents the voltage change across the base and emitter of the transistor. $V_{CB}$ represents the voltage change across the collector and base of the transistor. $I_E$ represents the emitter current change. $I_{OTS}$ represents the current through the threshold switch and $V_B$ represents the change in the base voltage. In the left portion of FIG. 7 the read operation is shown. This read action charges the base-collector capacitance, resulting in a loss of the stored information. The write operation shown in the right hand portion of FIG. 7 is required to restore or refresh the memory cell. This is therefore a destructive read out memory cell requiring refresh. In FIG. 8, the wave forms are similar to that of FIG. 7 except they represent the operation of the memory cell of FIG. 1B the timing wave form of the write signal W is also illustrated to show its effect upon the operation of the memory cell.

EPILOGUE

A single transistor memory cell has been described above which can be implemented with bipolar technology without damaging the transistor due to emitter base breakdown. The cell employs a threshold switching device to provide the charging current to the capacitance of the cell which is the inherent collector base capacitance of the transistor. By employing amorphous semiconductor material for the threshold switch, the threshold switch can be fabricated on top of the bipolar transistor thereby reducing the area of the memory cell in the semiconductor wafer and increasing the packing density. A particular amorphous semiconductor material employed in the present invention is the tellurium based chalcogenides which is characterized by a voltage threshold before becoming a high conducting material.

While but few embodiments of the present invention have been illustrated, it will be apparent to one skilled in the art that changes and modifications may be made therein without departing from the spirit and the scope of the invention claimed.

What is claimed is:

1. A single transistor cell memory array comprising:
   at least one single transistor cell having a transistor and a threshold switch;
   said transistor being formed with a collector region, a base region, and an emitter region, there being a base-collector capacitance associated with said base and collector regions;
   said threshold switch having a conductive state and a nonconductive state, said switch being electrically coupled to said base region, said switch being formed of a layer of a tellurium base chalcogenide, and said switch normally residing in a nonconducting state;
   means coupled between said emitter and said collector regions for charging said base-collector capacitance to place said single transistor cell in a first memory state;
   means coupled to said threshold switch and one of said emitter and collector regions to apply a signal to switch said threshold switch to its conductive state to discharge said base-collector capacitance to place said single transistor cell in a second memory state; and
   means coupled between said emitter and said collector regions to determine the charge condition of said base-collector capacitance to determine the memory state of said single transistor cell.

2. A memory cell according to claim 1 wherein:
   said tellurium based chalcogenide is $Ge_{15}Te_{81}Sb_2S_2$.

3. A memory cell according to claim 1 including:
   a conductive strip coupling said base region to said threshold switch.

4. A memory cell according to claim 1 wherein:
   the layer of tellurium based chalcogenide of which said threshold switch is formed is in contiguous contact with said base region.

5. An array of single transistor memory cells comprising:
   a crystalline substrate having a first plurality of conductors formed therein and a second plurality of conductors, said crystalline substrate also having formed therein a plurality of transistors each having a collector region, a base region, and an emitter region, there being a base-collector capacitance associated with said base and collector regions;
   a plurality of threshold switches having conductive and nonconductive states, one for each transistor, said threshold switches each being coupled to said base region of its corresponding transistor, each threshold switch being formed of a layer of a tellurium based chalcogenide, said switches normally residing in a nonconducting state;
   means coupled between said emitter and said collector regions of each said cell for charging said base-collector capacitance to place said single transistor cell in a first memory state;
   means coupled to said threshold switch and one of said emitter and collector regions of each of said cell to apply a signal to switch said threshold switch to its conductive state to discharge said base-collector capacitance to place said single transistor cell in a second memory state; and
   means coupled between said emitter and said collector regions of each said cell to determine the charge condition of the corresponding said base-collector capacitance to determine the memory state of said single transistor cell.

6. An array according to claim 5 wherein:
   each of said memory cells is provided with a write conductor coupled thereto by said threshold switch.

7. An array according to claim 5 wherein:
   said -tellurium based chalcogenide is formed of $Ge_{15}Te_{81}Sb_2S_2$.

* * * * *